(12) United States Patent
Matsuda et al.

(10) Patent No.: US 7,478,311 B2
(45) Date of Patent: Jan. 13, 2009

(54) ERROR DETECTION DEVICE AND ERROR DETECTION METHOD

(75) Inventors: Syuji Matsuda, Osaka (JP); Hiroyuki Yabuno, Osaka (JP)

(73) Assignee: Panasonic Corporation, Osaka (JP)

( * ) Notice: Subject to any disclaimer, the term of this patent is extended or adjusted under 35 U.S.C. 154(b) by 508 days.

(21) Appl. No.: 10/569,960

(22) PCT Filed: Aug. 19, 2004

(86) PCT No.: PCT/JP2004/012246

§ 371 (c)(1),
(2), (4) Date: Feb. 28, 2006

(87) PCT Pub. No.: WO2005/022755

PCT Pub. Date: Oct. 3, 2005

(65) Prior Publication Data

US 2007/0033506 A1 Feb. 8, 2007

(30) Foreign Application Priority Data

Aug. 29, 2003 (JP) ............................. 2003-307509

(51) Int. Cl.
*H03M 13/00* (2006.01)
(52) U.S. Cl. ...................... 714/785; 714/763; 714/758; 714/793
(58) Field of Classification Search ................. 714/763, 714/785, 793, 758
See application file for complete search history.

(56) References Cited

U.S. PATENT DOCUMENTS 5,414,719 A 5/1995 Iwaki et al.

| 5,457,702 A | 10/1995 | Williams et al. |
| 5,517,509 A | 5/1996 | Yoneda |
| 5,920,578 A | 7/1999 | Zook |
| 6,048,090 A | 4/2000 | Zook |

(Continued)

FOREIGN PATENT DOCUMENTS

JP  5-315974  11/1993

(Continued)

OTHER PUBLICATIONS

European Search Report issued Jan. 29, 2008.

*Primary Examiner*—Guy J Lamarre
(74) *Attorney, Agent, or Firm*—Wenderoth, Lind & Ponack, L.L.P.

(57) ABSTRACT

In an error detection method of the present invention, target code strings which are inputted in a discontinuous arrangement are subjected to a syndrome operation, and simultaneously, the target code strings which are inputted in a discontinuous arrangement are subjected to a first error detection code operation while correcting the inter-data continuity by skipping the data so that the arrangement of the code strings have continuity. Then, error data positions and error data numerical values of the target code strings are calculated on the basis of a syndrome obtained in the syndrome operation, and only the error data position among the target code strings are subjected to a second error detection code operation again on the basis of the error data positions and the error data numerical values. Using the operation result, the operation result by the first error detection code operation is updated, thereby simultaneously performing ECC processing and EDC processing for the target code strings which are inputted in a discontinuous arrangement.

9 Claims, 13 Drawing Sheets

U.S. PATENT DOCUMENTS

| | | | |
|---|---|---|---|
| 6,131,178 A * | 10/2000 | Fujita et al. | 714/784 |
| 6,138,264 A * | 10/2000 | Nava et al. | 714/785 |
| 6,336,203 B1 * | 1/2002 | Yoshida | 714/785 |
| 6,732,325 B1 * | 5/2004 | Tash et al. | 714/785 |
| 2001/0014960 A1 | 8/2001 | Ohyama et al. | |

FOREIGN PATENT DOCUMENTS

| | | |
|---|---|---|
| JP | 7-50595 | 2/1995 |
| JP | 7-230388 | 8/1995 |
| JP | 2000-224049 | 8/2000 |
| JP | 2001-23316 | 1/2001 |
| JP | 2001-292066 | 10/2001 |

* cited by examiner

US 7,478,311 B2

ERROR DETECTION DEVICE AND ERROR DETECTION METHOD

TECHNICAL FIELD

The present invention relates to an error detection apparatus and an error detection method and, more particularly, to those for executing error correction and error detection simultaneously.

BACKGROUND ART

In a system performing recording/playback of digital data, errors may occur in the data during playback or recording, and therefore, it is necessary to perform error correction, and error detection for checking as to whether the performed error correction is correct or not.

For example, during recording/playback of a DVD as an optical recording medium, a method called ECC (Error Correcting Code) and a method called EDC (Error Detecting Code) are used for error correction and error detection, respectively.

The ECC processing is executed in units of error correcting code blocks (hereinafter, referred to as "ECC blocks"), and each ECC block comprises 16 sectors as shown in FIG. 11. The EDC processing is executed in units of sectors in the ECC blocks, and one sector has a structure as shown in FIG. 12.

Hereinafter, the outline of ECC decoding will be described with reference to FIGS. 11 to 14, taking, as an example, a case where data recorded in a DVD as an optical recording medium are subjected to error correction.

Initially, when subjecting the data recorded on the DVD to error correction, ECC-coded data which are read from the DVD are decoded, and the read data are subjected to error correction in a C1 direction or a C2 direction shown in FIG. 11. At this time, a position polynomial and a numeric polynomial are generated from the ECC-decoded data, and the roots thereof are obtained to derive error data positions and error data numerical values.

When code strings in one ECC block are subjected to error correction in the C1 direction or the C2 direction, if errors that exceed the error correction ability exist in the data, the data code strings that exceed the error correction ability are regarded as uncorrectable code strings as shown in FIG. 13, and information relating to the uncorrectable code strings is stored as information of lost positions.

After error correction has ended for all the code strings in the one ECC block in the C1 direction or the C2 direction shown in FIG. 11, error correction is again carried out for the code strings in the one ECC block in the direction different from that for the previous error correction (C2 direction or C1 direction) using the lost position information.

When performing error correction using the lost position information, since the error data positions have previously been known, it is only necessary to obtain a numerical polynomial when generating the above-mentioned polynomial. As the result, the error correction ability can be enhanced.

For example, it is assumed that, when error correction is initially carried out in the C1 direction for all the code strings in the one ECC block as shown in FIG. 13, the 50th, 90th, 130th, and 200th rows in the one ECC block are uncorrectable code strings. Thereafter, as shown in FIG. 14, error correction is carried out in the C2 direction that is different from the direction for the first error correction. At this time, on the basis of the lost position information indicating the uncorrectable code strings, the 50th, 90th, 130th, and 200th bytes in the one ECC block are designated as lost position information, whereby the error correction ability in the C2 direction can be enhanced. This method realizes error correction without degrading the correction ability for burst errors that occur in the transmission system.

When performing error correction and error detection for data code strings, conventionally, EDC operation is carried out in sector units in one ECC block after the ECC processing for one ECC block has ended.

Hereinafter, the outline of the ECD operation will be described with reference to FIGS. 14 and 15. FIG. 15 is a diagram illustrating the construction of an EDC operation circuit, wherein a 4-byte-input EDC operation circuit is shown.

Initially, an EDC operational formula is as follows.

$$EDC(x) = \sum_{i=31}^{0} b_i x^i = l(x) \bmod\{g(x)\}$$

$$l(x) = \sum_{i=16511}^{32} b_i x^i \quad g(x) = x^{32} + x^{31} + x^4 + 1$$

In the above-mentioned EDC operational formula, with reference to the ECD operation circuit shown in FIG. 15, EXOR circuits are disposed at the inputs of the 0th bit, 4th bit, and 31st bit of a 32-bit shift register. In the EXOR operation circuit, EXOR between a bit input from the most significant bit in the 4 bytes and the 31st bit, EXOR between the 3rd bit and the 31st bit, and EXOR between the 30th bit and the 31st bit are respectively calculated by the EXOR circuits.

As is understood from the above-mentioned EDC operational formula or the EDC operation circuit shown in FIG. 15, the EDC operation is a linear operation along the data recording direction (the C1 direction shown in FIG. 11).

When one sector having the structure as shown in FIG. 12 is inputted to the EDC operation circuit shown in FIG. 15, each for 4 bytes, in the data recording direction, i.e., in the order of ID area, IEC area, RSV area, user data area, and EDC area, the 32-bit shift register values obtained after the EDC area as the last 4 bytes is inputted becomes the EDC operation result.

As described above, conventionally, the method of performing error detection (EDC) after performing error correction (ECC) has commonly been employed. In this method, however, since error detection is carried out after an ECC block as one unit for error correction has been read from a buffer and subjected to error correction, the ECC block must be reread from the buffer, leading to problems such as consumption of the band width of the memory buffer, and increase in the processing time.

As a method for solving the problems such as consumption of the band width of the memory buffer and increase in the processing time, it is thought that the both processings of ECC and EDC are simultaneously carried out by reading an ECC block only one time from the buffer.

Since, as described above, the EDC operation is a linear operation along the data recording direction (C1 direction in FIG. 11), when error correction id carried out by the error correction circuit in the C1 direction in which the arrangement of the input data has continuity as shown in FIG. 13, it is possible to simultaneously perform the ECC in the C1 direction and the above-mentioned EDC. However, when error correction is carried out in the C2 direction in which the arrangement of the input data has no continuity as shown in FIG. 14, it is very difficult to simultaneously perform the ECC in the C2 direction and the EDC operation, and therefore, it is difficult to implement such simultaneous processings in a semiconductor.

The present invention is made to solve the above-described problems and has for its object to provide an error detection apparatus and an error detection method which can perform error correction and error detection simultaneously even when target code strings to be subjected to error detection in an ECC block are inputted in an arrangement having no continuity (C2 direction in FIG. 11).

DISCLOSURE OF THE INVENTION

An error detection apparatus according to the present invention is an error detection apparatus having a syndrome operator for performing syndrome operation to target code strings, each target code string comprising plural sectors and each sector comprising matrix data, and performing an error correction processing by an error correction circuit to the target code strings, and simultaneously, performing error detection to the target code strings in sector units, which error detection apparatus comprises: an error detection code operation circuit for calculating error detection codes in the target code strings; an error detection code skip operation circuit for, when the target code strings are inputted in a discontinuous arrangement, performing a skip operation for correcting the inter-data continuity by skipping the data so as to make the arrangement of the code strings continuous; a first error detection control circuit for controlling a first error detection code operation performed by the error detection code operation circuit or the error detection code skip operation circuit, which is carried out simultaneously with the syndrome operation; a second error detection control circuit for controlling, after the error correction processing, a second error detection code operation only for data indicated by error data position on the basis of the error data positions and error data numeral values that are obtained by the error correction processing, and controlling an updation processing for updating the operation result of the first error detection code operation on the basis of the operation result of the second error detection code operation; and a memory for holding the operation results by the error detection code operation circuit, and the error detection code skip operation circuit.

Therefore, it is possible to perform data correction and data detection simultaneously, even when target code strings to be subjected to ECC block error detection are inputted in a discontinuous arrangement.

Further, in the error detection apparatus of the present invention, the error detection code skip operation circuit receives error detection codes of target code strings which have been inputted by the last time, and performs a skip operation which has previously been set in the error detection code skip operation circuit.

Therefore, the skip operation can be carried out by a simple processing, and simultaneous execution of error correction and error detection can be implemented in a semiconductor circuit.

Further, in the error detection apparatus according to the present invention, the memory comprises a first memory for holding the per-sector operation results by the error detection code operation circuit and the error detection code skip operation circuit when the target code strings are inputted in a continuous arrangement, and holding the halfway operation results for each sector by the error detection code operation circuit and the error detection code skip operation circuit when the target code strings are inputted in a discontinuous arrangement; and a second memory for holding the operation results transmitted from the first memory, for each sector.

Therefore, it is possible to obtain the EDC operation result for each sector even when target code strings to be subjected to ECC block error detection are inputted in a discontinuous arrangement.

Further, in the error detection apparatus according to the present invention, the first memory comprises a memory for holding the operation result by the first error detection code operation which is executed by the error detection code operation circuit and the error detection code skip operation circuit; and a memory for holding a difference operation result by the second error detection code operation, for updating the operation result of the first error detection code operation.

Therefore, a correct EDC operation result can be obtained by a simple processing, and simultaneous execution of error correction and error detection can be implemented in a semiconductor circuit.

Further, in the error detection apparatus according to the present invention, when the target code strings are inputted in a discontinuous arrangement, the error detection code skip operation circuit performs a skip operation for skipping a predetermined number of bytes in non-final rows in the sector among the target code strings, and performs an individual skip operation for skipping a number of bytes according to column positions where data exist, in a final row in the sector among the target code strings.

Therefore, the EDC operation can be carried out even when the target code strings are inputted in a discontinuous arrangement, and simultaneous execution of error correction and error detection can be implemented in a semiconductor circuit.

Further, the error detection apparatus according to the present invention further includes scramble removal unit for collectively removing scramble components in the target code strings.

Therefore, processing resources can be minimized.

Further, in the error detection apparatus according to the present invention, the scramble removal unit includes a table which holds data for removing scramble components in the target code strings.

Therefore, it is possible to collectively remove scramble components in the target code strings.

Further, an error detection method according to the present invention is an error detection method for performing error correction in units of error correction unit blocks for target code strings inputted in a discontinuous arrangement, each target code string being constituted by plural sectors each comprising matrix data, and simultaneously, performing error detection in sector units for the target code strings inputted in a discontinuous arrangement, which error detection method comprises: a syndrome operation step of performing a syndrome operation to the target code strings; a first error detection code operation step of performing an error detection code operation to the target code strings inputted in a discontinuous arrangement, which is performed simultaneously with the syndrome operation step; an error correction step of performing error correction by calculating error data positions and error data numeral values of the target code strings, on the basis of the syndrome obtained in the syndrome operation step; a second error detection code operation step of performing an error detection code operation again to only data in the error data positions among the target code strings, on the basis of the error data positions and the error data numeral values which are obtained in the error correction step; and an updation step of updating the operation result by the first error detection code operation step, using the operation result by the second error detection code operation step; and each of the first error detection code operation step and the second error detection code operation step including an error detection code operation step of calculating error detection codes in the target code strings, and an error detection code skip operation step of performing a skip operation for correcting the inter-data continuity by skipping the data so as to continuously arranging the target code strings which are inputted in a discontinuous arrangement.

Therefore, it is possible to perform data correction and data detection simultaneously, even when target code strings to be subjected to ECC block error detection are inputted in a discontinuous arrangement.

Further, in the error detection method according to the present invention, the error detection code skip operation step receives error detection codes of target code strings which have been inputted by the last time, and performs a skip operation which has previously been set.

Therefore, the skip operation can be carried out by a simple processing, and simultaneous execution of error correction and error detection can be easily realized even when the arrangement of inputted data has not continuity.

Further, in the error detection method according to the present invention, the error detection code skip operation step comprises performing a skip operation for skipping a predetermined number of bytes in non-final rows in the sector among the target code strings, and performing an individual skip operation for skipping a number of bytes according to column positions where data exist, in a final row in the sector among the target code strings.

Therefore, the EDC operation can be carried out even when the target code strings are inputted in a discontinuous arrangement, and simultaneous execution of error correction and error detection can be implemented in a semiconductor circuit.

Further, in the error detection method according to the present invention, the individual skip operation is carried out by utilizing plural times the operation result of the skip operation that is executed in a specific column position among the column positions where data exist.

Therefore, the skip operation that exists separately can be reused plural times, without the necessity of preparing all skip operation processings corresponding to the respective detection operation unit columns in a sector, resulting in reduced consumption of processing resources.

Further, the error detection method according to the present invention includes a scramble removal step of removing scramble components included in the target code strings, which is carried out simultaneously with the updation step.

Therefore, it is possible to remove scramble components from the data after the ECC processing and the EDC processing.

Further, in the error detection method according to the present invention, after all data in one sector are inputted, the scramble removal step removes scramble components in the all data in the sector collectively.

Therefore, it is possible to reduce processing resources required for removal of scramble components.

Further, in the error detection method according to the present invention, the scramble removal step is carried out using a table which holds data for removing scramble components in the target code strings.

Therefore, it is possible to remove scramble components collectively from all the data after the ECC processing and the EDC processing.

BEST MODE TO EXECUTE THE INVENTION

Embodiment 1

Hereinafter, outline of simultaneous processings of error correction and error detection according to the first embodiment will be described with reference to FIG. 1. In this first embodiment, a description will be given of a case where data recorded on a DVD as an optical recording medium are subjected to error correction (ECC) and error detection (EDC). Further, an error correction code block as a single unit to be subjected to error correction (hereinafter referred to as "ECC block") is composed of sixteen sectors as shown in FIG. 11, and each sector has a structure shown in FIG. 12.

Figure 1:
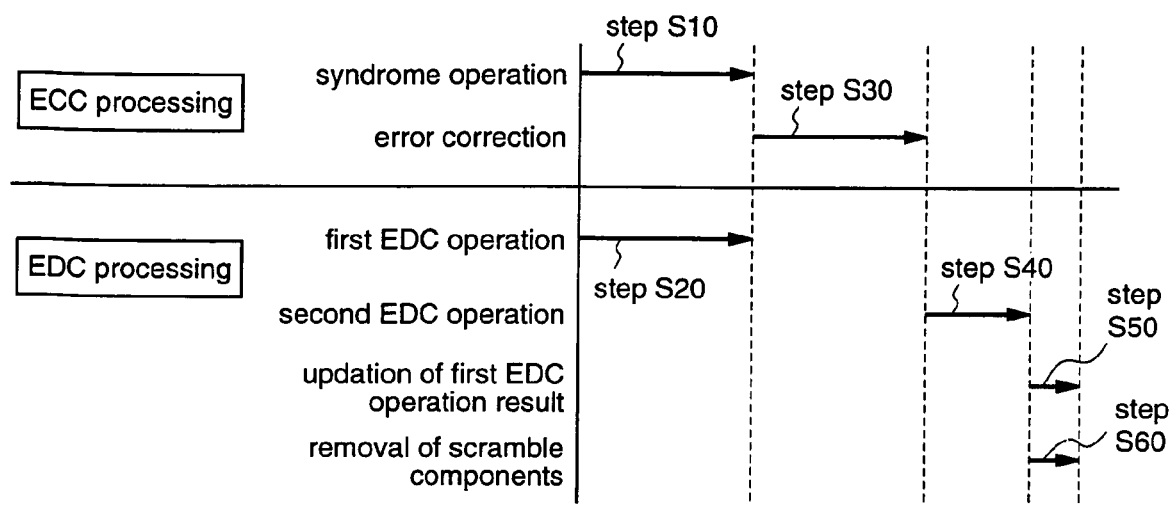
FIG. 1 is a diagram illustrating pipeline processing when executing ECC processing and EDC processing simultaneously, according to a first embodiment of the present invention.

FIG. 1 is a diagram for explaining a pipeline processing to be performed during the simultaneous execution of ECC processing and EDC processing.

Figure 11:
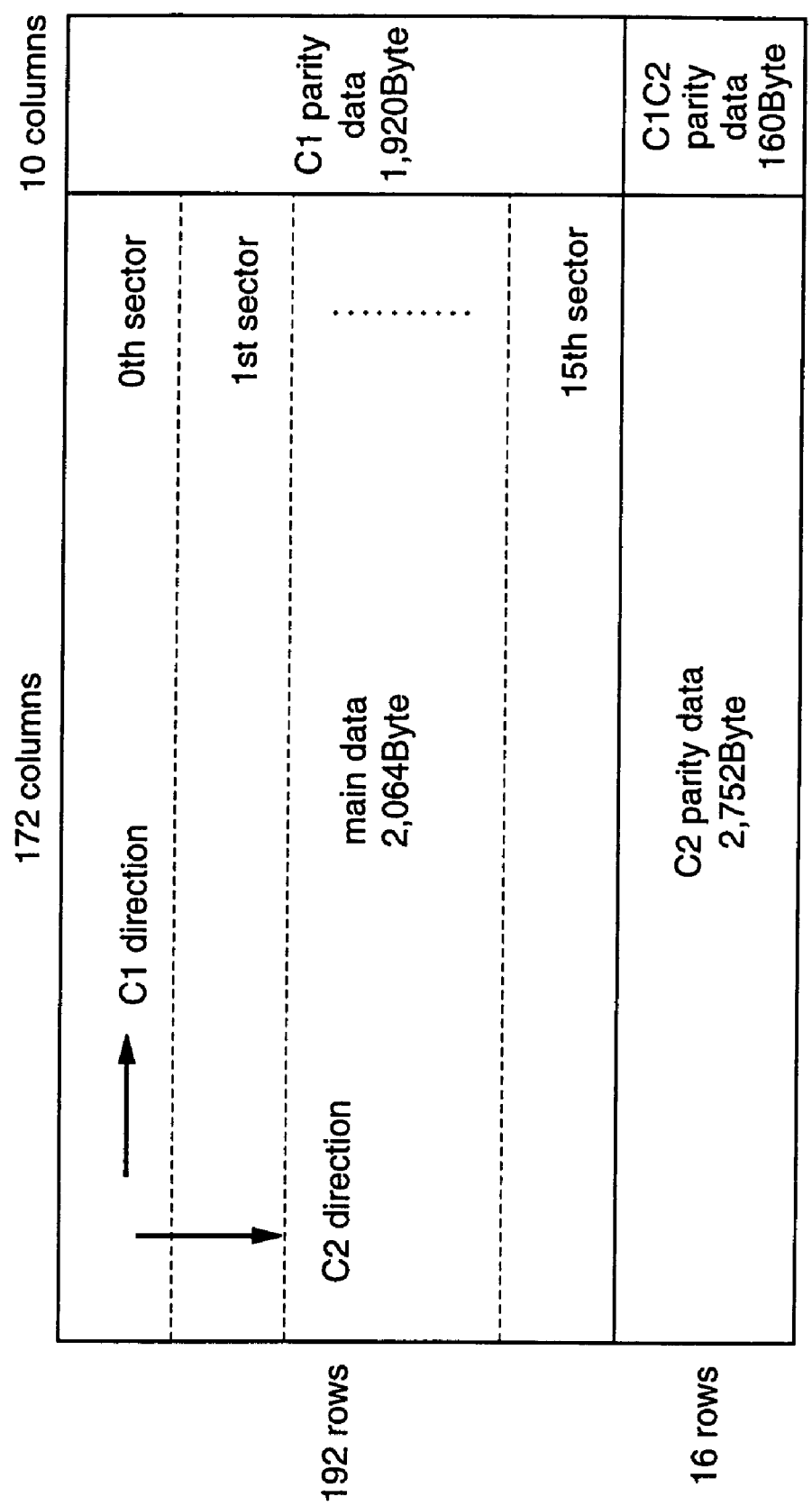
FIG. 11 is a diagram illustrating the structure of one ECC block obtained when data recorded on a DVD is divided into error correction unit blocks (ECC blocks).
Figure 12:
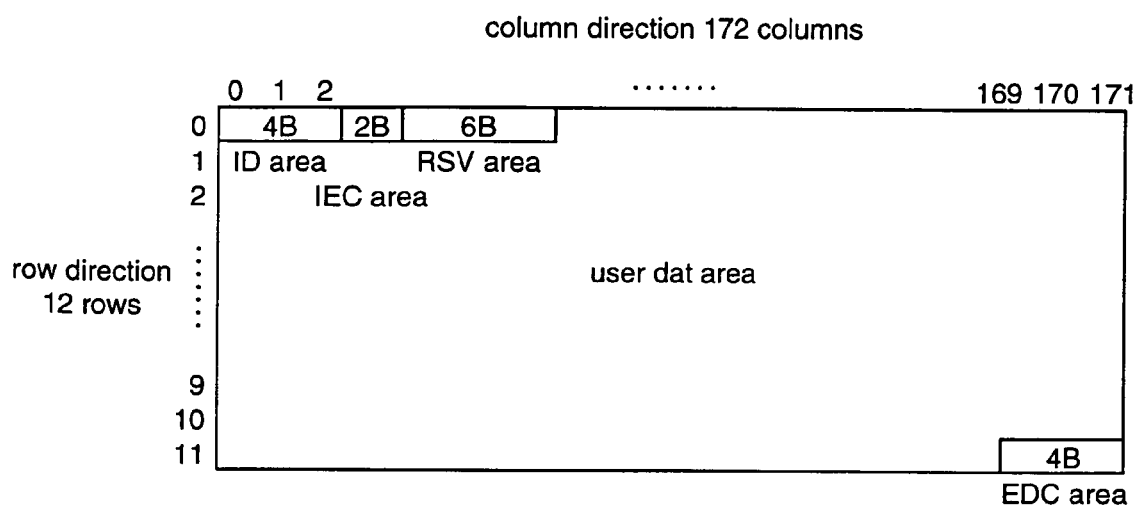
FIG. 12 is a diagram illustrating the structure of one sector on an ECC block.
Figure 13:
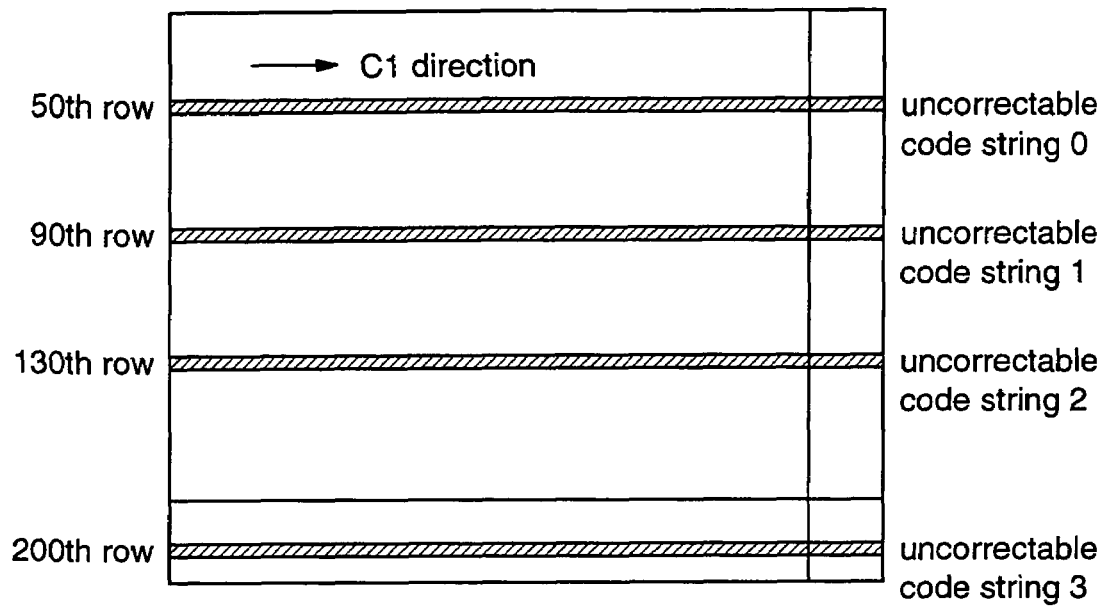
FIG. 13 is a diagram illustrating an example of error correction performed in the ECC block along C1 direction shown in FIG. 11.
Figure 14:
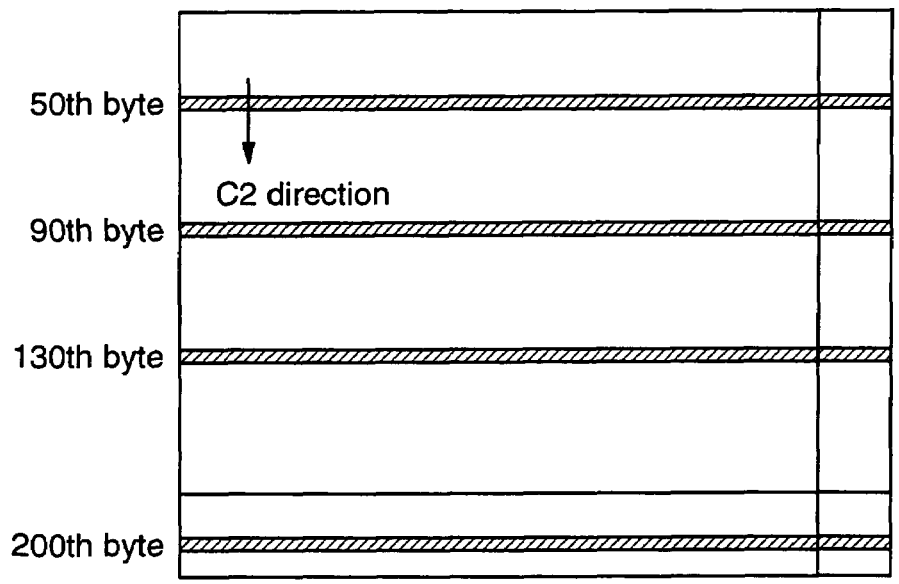
FIG. 14 is a diagram illustrating an example of error correction performed in the ECC block along C2 direction shown in FIG. 11.

When executing ECC processing and EDC processing, initially, in step S10, target data code strings to be subjected to error correction and error detection are supplied from the DVD in the C1 direction or the C2 direction of one ECC block as shown in FIG. 11, and the data code strings are subjected to syndrome operation of ECC processing. When the result of this syndrome operation is "0", it indicates that there is no error. When the result is not "0", it indicates that there are errors.

In step S20 which is the same pipeline processing stage as step S10, the data code strings which are inputted in the same order as that in step S10 are subjected to a first EDC operation, thereby to obtain a first error detection code operation result for every sector unit. The first error detection code operation result is a normal value when no error is included in the inputted data code strings, and it is an incorrect value when errors are included.

When the syndrome operation result obtained in step S10 is "0" and thereby it is determined that no error exists in the inputted data code strings, error correction in step S30 is not carried out to complete the sequence of processings. In this case, the first error detection code operation result obtained in step S20 is outputted as a correct EDC operation result obtained by the error detection apparatus.

On the other hand, when the syndrome operation result obtained in step S10 is not "0" and thereby it is determined that errors exist in the inputted data code strings, error correction is performed for the data code strings to obtain error data positions and error data numerical values (step S30).

Thereafter, in step S40, only the data indicated by the obtained error positions, among the data code strings supplied from the DVD, are subjected to a second EDC operation on the basis of the error data positions and the error data values obtained in step S30, thereby obtaining a second error detection code operation result. The second error detection code operation result thus obtained is information about difference between the correct EDC operation result obtained by the error detection apparatus and the first error detection code operation result obtained in step S20.

Accordingly, in step S50, the first error detection code operation result obtained in step S20 is updated using the second error detection code operation result obtained in step S40, and the updated error detection code operation result is outputted as a correct EDC operation result obtained by the error detection circuit.

Further, in step S60 which is the same pipeline processing stage as step S50, scramble components in the inputted data code strings are removed collectively, using a table that contains data for removing scramble components.

By performing the above-mentioned sequence of processings, it is possible to perform the ECC processing, the EDC processing, and the scramble component removal processing for the inputted data code strings, by reading the ECC block only one time from the buffer.

While in FIG. 1 the scramble components of the data code strings are collectively removed after the EDC operation, the scramble components are not necessarily removed collectively after the EDC operation. That is, when performing the EDC operation in step S20, this operation may be carried out while removing the scramble components every time a data code string is inputted.

Further, in the above description, playback of data recorded on a DVD is taken as an example, and it is assumed that inputted data code strings include scramble components. However, there are cases where inputted data code strings include no scramble components. For example, when recording data on a DVD, no scramble components are included in input data. Therefore, in this case, when performing the syndrome operation in step S10, this operation is carried out while adding scramble components every time a data code string is inputted. When adding the scramble components to the data code strings, it is impossible to perform this addition collectively, in contrast to the scramble removal shown in step S60.

Next, a description will be given of the construction of an error detection circuit according to the first embodiment, which is able to execute ECC processing and EDC processing simultaneously, with reference to FIG. 2. The error detection circuit will be described for the case where inputted data code strings include scramble components and the scramble components are collectively removed, as described with reference to FIG. 1.

Figure 2:
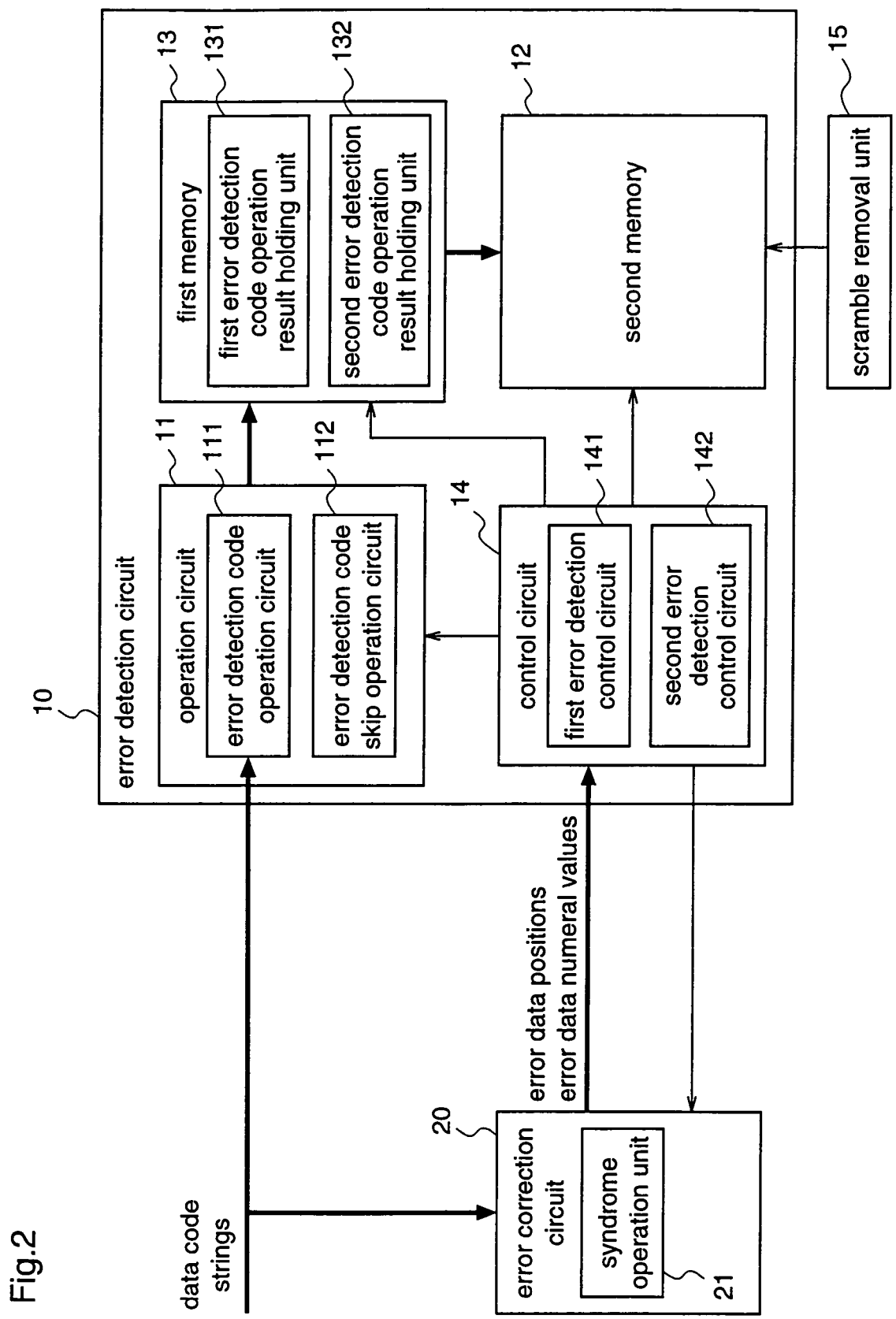
FIG. 2 is a diagram illustrating the construction of an error detection circuit according to the first embodiment of the present invention.

FIG. 2 is a diagram illustrating the construction of the error detection circuit according to the first embodiment.

The error detection circuit 10 according to the first embodiment can execute EDC processing simultaneously with ECC processing that is performed by an error detection circuit 20 including a syndrome operation unit 21 which performs syndrome operation to the data code strings. As shown in FIG. 2, the error detection circuit 10 comprises an operation circuit 11 comprising an error detection code operation circuit 111 and an error detection code skip operation circuit 112, a first memory 13 comprising a first error detection code operation result holding unit 131 and a second error detection code operation result holding unit 132, a second memory 12, and a control circuit 14 comprising a first error detection control circuit 141 and a second error detection control circuit 142. A scramble removal unit 15 removes scramble components from data code strings.

Hereinafter, the respective circuits will be described. The control circuit 14 controls the error detection circuit 10 when data code strings inputted to the error detection circuit 10 are subjected to error detection, and the first error detection control circuit 141 controls the first EDC operation (step S20 in FIG. 1) which is performed simultaneously with the syndrome operation that is performed for the data code strings by the syndrome operation unit 21 included in the error correction circuit 20, while the second error detection control circuit 142 controls the second EDC operation after the error correction by the error correction circuit 20 as well as the updation of the first EDC operation result (steps S40 and S50 in FIG. 1).

The operation circuit 11 performs error detection operation for the data code strings that are inputted under control of the control circuit 14, and the error detection code operation circuit 111 calculate error detection codes in the data code strings for every predetermined data (in this first embodiment, for every four bytes) when the data code strings are inputted in the C1 direction shown in FIG. 11, i.e., in an arrangement having continuity, while the error detection code skip operation circuit 112 performs skip operation for correcting continuity among inputted data by skipping the data to make the inputted data have continuity, when the data code strings are inputted in the C2 direction shown in FIG. 11, i.e., in an arrangement having no continuity.

Then, the first memory 13 holds the halfway operation result which is obtained by the operation circuit 11, and the first error detection code operation result holding unit 131 holds the operation result obtained by the first EDC operation (step S20 in FIG. 1) that is performed under control of the first error detection control circuit 141, while the second error detection code operation result holding unit 132 holds the operation result that is obtained by the second EDC operation (step S40 in FIG. 1) that is performed under control of the second error detection control circuit 14, i.e., it holds the difference information for updating the operation result obtained by the first EDC operation.

The second memory 12 holds the operation result outputted from the first memory 13, for every sector. After the second EDC operation, the first EDC operation result is updated by the second EDC operation result, and a correct EDC operation result is stored in the second memory 12.

Hereinafter, a description will be given of the operation of simultaneously executing the ECC processing and the EDC processing.

Initially, when the target data code strings are corrected by the error correction circuit 20 in the C1 direction shown in FIG. 11, the data code strings to be subjected to error correction and error detection, which are equivalent to one ECC block, are supplied in a continuous arrangement, from the DVD along the C1 direction shown in FIG. 11 to the error correction circuit 20 and to the error detection circuit 10. On receipt of the data code strings, in the error correction circuit 20, the syndrome operation unit 21 performs a syndrome operation of the ECC processing (step S10 in FIG. 1). Simultaneously, in the error detection circuit 10, the error detection code operation circuit 111 of the operation circuit 11 performs the first EDC operation (step S20 in FIG. 1) under control of the first error detection control circuit 141, thereby obtaining the first error detection code operation result for each sector unit. The first error detection code operation result is stored in the first error detection code operation result holding unit 131 of the first memory 13.

On the other hand, when the target data code strings are corrected in the C2 direction shown in FIG. 11 by the error correction circuit 20, the data code strings to be subjected to error correction and error detection, which are equivalent to one ECC block, are supplied in a discontinuous arrangement, from the DVD along the C2 direction shown in FIG. 11 to the error correction circuit 20 and the error detection circuit 10.

Figure 3:
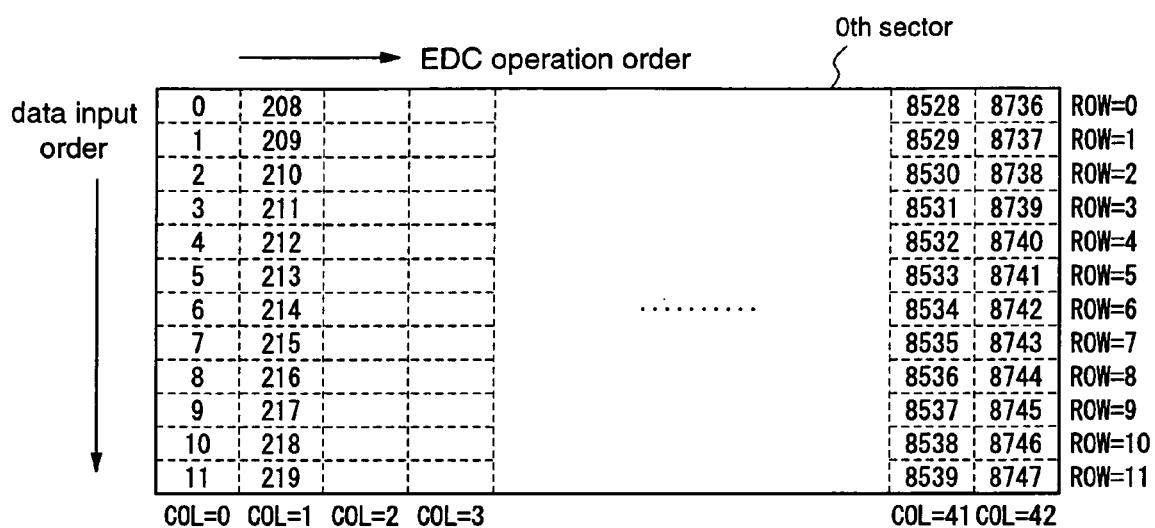
FIG. 3 is a diagram illustrating data inputting order to an error correction circuit and an error detection circuit when a data input unit in the 0th sector is 4 bytes during correction in C2 direction, according to the first embodiment of the present invention.

More specifically, the data code strings inputted to the error correction circuit 20 and the error detection circuit 10 are as shown in FIG. 3. FIG. 3 is a diagram illustrating the data inputting order of data code strings to the error correction circuit and the error detection circuit as well as the EDC operation order for the data code strings, when the data code strings in the 0th sector in the one ECC block are subjected to error correction in the C2 direction according to the first embodiment.

When the data code strings are inputted in such discontinuous arrangement, the first EDC operation is carried out by the error detection code skip operation circuit 112 of the operation circuit 11 in the error detection circuit 10, under control of the first error detection control circuit 141, simultaneously with execution of the syndrome operation by the syndrome operation unit 21 in the error correction circuit 20.

Hereinafter, a description will be given of the case where the EDC operation is carried out simultaneously with the error correction in the C2 direction by the error correction circuit, with reference to FIGS. 4 and 5.

Figure 4:
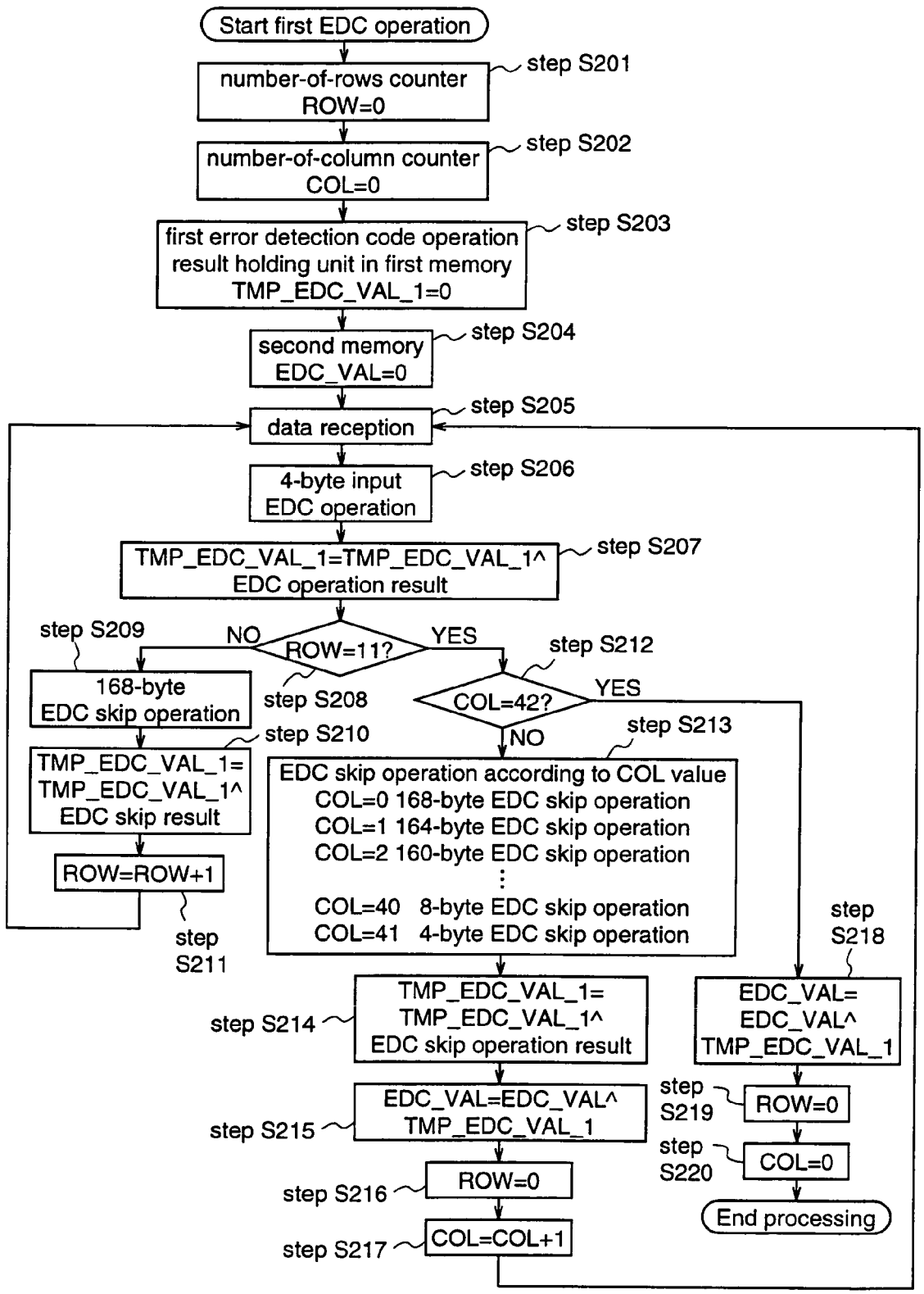
FIG. 4 is a flowchart illustrating a sequence of steps of a first EDC operation during correction in C2 direction, which is performed by the error detection circuit according to the first embodiment of the present invention.
Figure 5:
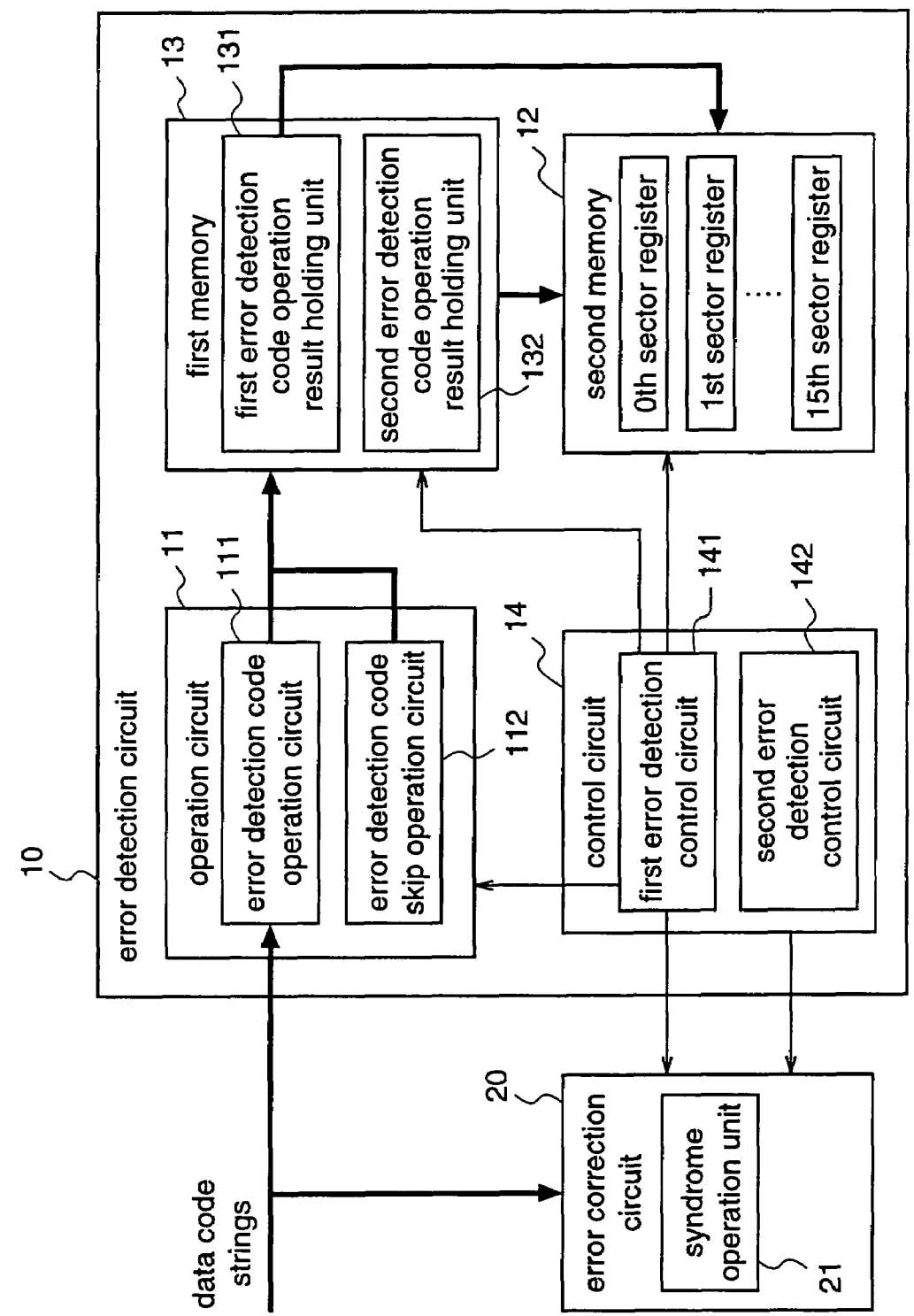
FIG. 5 is a diagram illustrating a flow of data in the first EDC operation during correction in C2 direction, of the error detection circuit according to the first embodiment of the present invention.

FIG. 4 is a flowchart illustrating the first EDC operation when data code strings are inputted in a discontinuous arrangement to the error detection circuit, and FIG. 5 is a diagram illustrating a flow of data during the first EDC operation.

As shown in FIG. 4, when the first EDC operation is started, initially, an intra-sector row number counter "ROW" and an intra-sector column number counter "COL" which are held in the first error detection control circuit 141 are initialized (steps S201 and S202). Then, the value stored in the first error detection code operation result holding unit 131 (hereinafter referred to as "TMP_EDC_VAL_1") and the value of the second memory 12 (hereinafter referred to as "EDC_VAL") are initialized (steps S203 and S204).

Thereafter, the error detection circuit 10 and the error correction circuit 20 receive 4 bytes of the data code strings. The received data is the 0th data shown in FIG. 3 (step S205).

Then, the error detection code operation circuit 111 subjects the received data to an EDC operation for the 4-byte input which is described later (step S206), and a value obtained by performing EXOR between the operation result and the "TMP_EDC_VAL_1" is again stored in the "TMP_EDC_VAL_1" (step S207).

After the EDC operation for the 0th data is completed as described above, a data code string to be inputted next corresponds to the 1st data shown in FIG. 3. The next inputted 1st data has no continuity in data arrangement with the previously inputted 0th data.

Whether there is continuity in data arrangement or not is determined as follows. That is, in the first error detection control circuit 141, the intra-sector row number counter "ROW" that is currently processed is checked, and when the intra-sector row number counter "ROW" is not "11" that is the last row in the sector, it is determined that there is no continuity in data (step S208).

When it is determined in the first error detection control circuit 141 that there is no continuity in data, 168-byte skipping EDC skip operation is carried out by the error detection code skip operation circuit 112 in the operation circuit 11 under control of the first error detection control circuit 141, in order to correct the continuity between the 0th data and the 1st data (step S209). The detail of this processing will be described later.

Then, a value obtained by performing EXOR between the skip operation result obtained by the error detection code skip operation circuit 112 and the "TMP_EDC_VAL_1" is again stored in the "TMP_EDC_VAL_1" (step S210).

Thereafter, the first error detection control circuit 141 increments the intra-sector row number counter "ROW" by 1 (step S211), and moves to the EDC operation for the next row.

The above-mentioned processing is repeated until the intra-sector number-or-rows counter "ROW" becomes "11" that is the last row in the sector.

When the intra-sector row number counter "ROW" becomes "11" in step S208, the EDC operation for the 4-byte input corresponding to the 11th data input or the 219th, ..., 8539th data input has been ended.

Since the EDC skip operation performed by the error detection code skip operation circuit 112 differs for each "COL" value until the intra-sector column number counter "COL" becomes "42", the first error detection control circuit 141 performs control so that the EDC skip operation becomes an individual processing corresponding to the current value of the intra-sector column number counter "COL", every time the intra-sector row number counter "ROW" becomes "11".

For example, at the point in time of step S213, when the current value of the intra-sector column number counter "COL" is "1", i.e., when the EDC operation has ended up to the 219th data shown in FIG. 3, since a difference between the 219th data and the 8747th data which is the last data in the sector as well as an EDC area shown in FIG. 3 is 164 bytes, the first error detection control circuit 141 performs control so that the error detection code skip operation circuit 112 performs an EDC skip operation for skipping the data by 164 bytes. Further, at the point in time of step S213, when the value of the intra-sector column number counter "COL" is "41", i.e., when the EDC operation has ended up to the 8539th data shown in FIG. 3, since a difference between the 8539th data and the 8747th data which is the last data as well as an EDC area shown in FIG. 3 is 4 bytes, the first error detection control circuit 141 performs control so that the error detection code skip operation circuit 112 performs an EDC skip operation for skipping the data by 4 bytes.

Then, the skip operation result by the error detection code skip operation circuit 112, which varies for every value of the intra-sector column number counter "COL", is EXORed with the "TMP_EDC_VAL_1", and the resultant value is again stored in the "TMP_EDC_VAL_1" (step S214).

At this point in time, since the operation result equivalent to one column in the sector is stored in the first error detection code operation result holding unit 131 ("TMP_EDC_VAL_1") in the first memory 13, the held operation value is outputted to the second memory 12 ("EDC_VAL") by the first error control circuit 141 as shown in FIG. 5 to store it in the corresponding sector register in the second memory 12. That is, a value obtained by performing EXOR between the "EDC_VAL" and the "TMP_EDC_VAL_1" is again stored in the "EDC_VAL" (step S215). For example, when the "COL" in the current 0th sector is "1", i.e., when the EDC operation has ended up to the 219th data shown in FIG. 3 and a obtained by performing EXOR for the 208th~219th data shown in FIG. 3 is stored in the "TMP_EDC_VAL_1", this value is outputted to the 0th sector register in the "EDC_VAL".

Thereafter, the "ROW" is initialized (step S216), and the "COL" is incremented by 1 (step S217).

On the other hand, when the "ROW" is "11" in step S208 and the "COL" is "42" in step S212, since the 4-byte input EDC operation corresponding to the 8747th data input shown in FIG. 3 has just ended, a value obtained by EXOR between the "EDC_VAL" and the "TMP_EDC_VAL_1" is again stored in the "EDC_VAL" (step S218), and the "ROW" and "COL" are initialized (steps S219 and S220) to complete the processing.

Through the above-mentioned steps, all the first EDC operation results in the 0th sector in the ECC block shown in FIG. 3 are obtained, thereby completing the processing.

After the first EDC operation for all the sixteen sectors in one ECC block has ended in step S20 as described above, when the syndrome operation value in the error correction circuit 20 is not "0" in step S10, i.e., it is judged that errors are included, error correction is carried out (step S30 in FIG. 1). When the syndrome operation value is "0", the sequence of processings is ended in this stage, and the first EDC operation result is outputted as a correct EDC operation result obtained by the error detection circuit 10.

When the syndrome operation value in the error correction circuit 20 is not "0ff, only the parts indicated by the error data positions are subjected to the second EDC operation, using the error data positions and the error data values obtained during the error correction in step S30.

As for the second EDC operation, it is carried out by the error detection code operation circuit 111 and the error detection code skip operation circuit 112, alike the above-mentioned first EDC operation, under control of the second error detection control circuit 142. However, among the inputted data code strings, the second EDC operation is performed for only the data indicated by the error data positions obtained during the error correction by the error correction circuit 20 in step S30. The result of the second EDC operation is stored in the second error detection code operation result holding unit 132 (hereinafter referred to as "TMP_EDC_VAL_2") in the first memory 13, as indicated by the data flow during the second EDC operation shown in FIG. 6. The value stored in the "TMP_EDC_VAL_2" is, as described above, difference information between the correct EDC operation result to be obtained by the error detection circuit 10 and the first error detection code operation result that is actually obtained by the first EDC operation in step S20 and is currently stored in the "EDC_VAL" (second memory 12).

Figure 6:
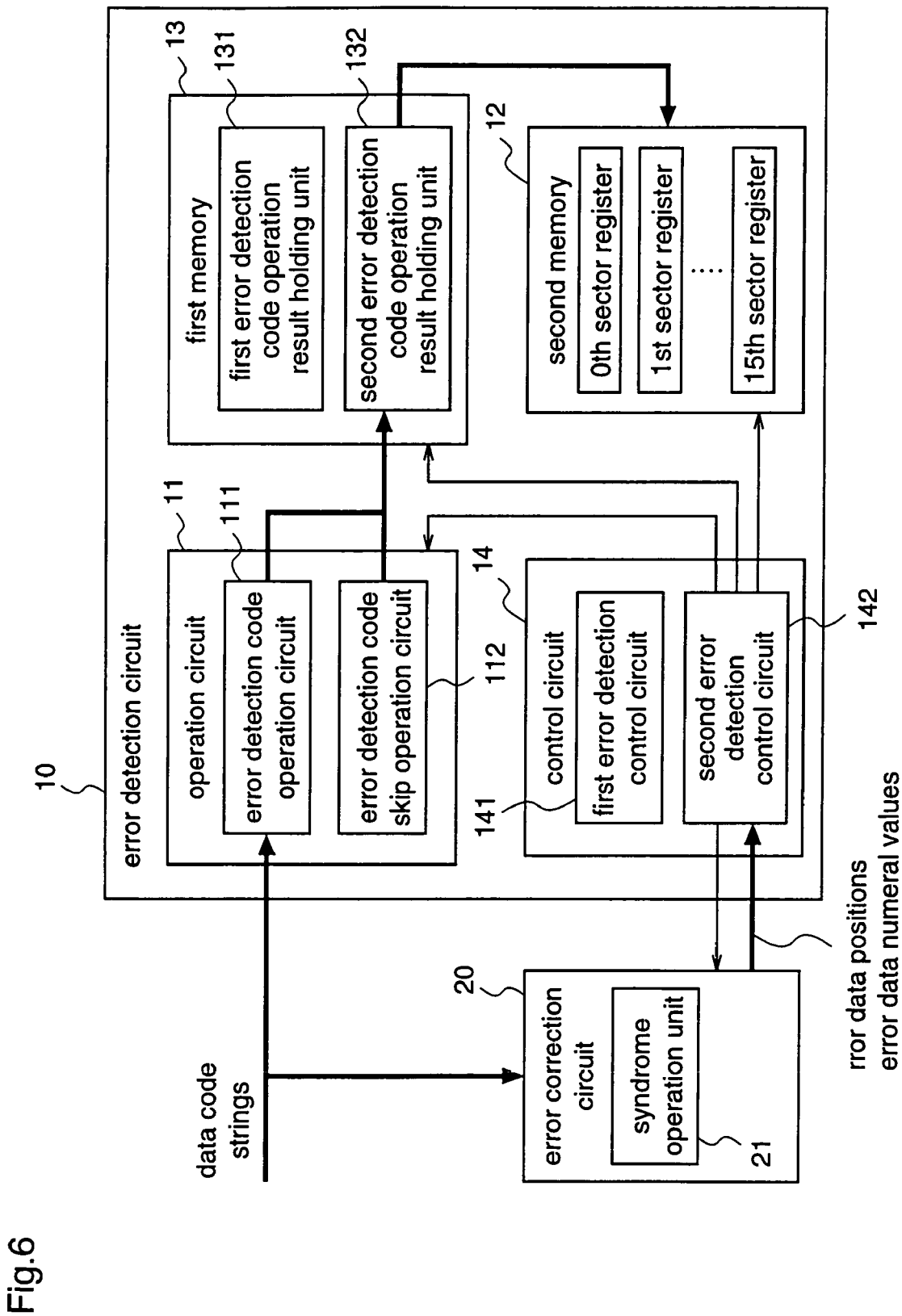
FIG. 6 is a diagram illustrating a flow of data in a second EDC operation during correction in C2 direction, of the error detection circuit according to the first embodiment of the present invention.

Accordingly, after the second EDC processing has ended with respect to the error data positions that are obtained during the error correction by the error correction circuit 20 in step S30 (step S40 in FIG. 1), the second error detection control circuit 142 calculates an EXOR between the "TMP_EDC_VAL_2" and the "EDC_VAL" to update the value of the "EDC_VAL" as shown in FIG. 6, thereby obtaining a correct error detection code operation result (step S50 in FIG. 1).

Then, collective removal of scramble components is carried out by the scramble removal unit 15 simultaneously with obtaining the correct error detection code operation result stored in the second memory 12 (step S60 in FIG. 1). In this processing, a table holding data for removing scramble components is provided in the scramble removal unit 15, and scramble components in the data code strings after the EDC operation are collectively removed using the table.

Figure 9:
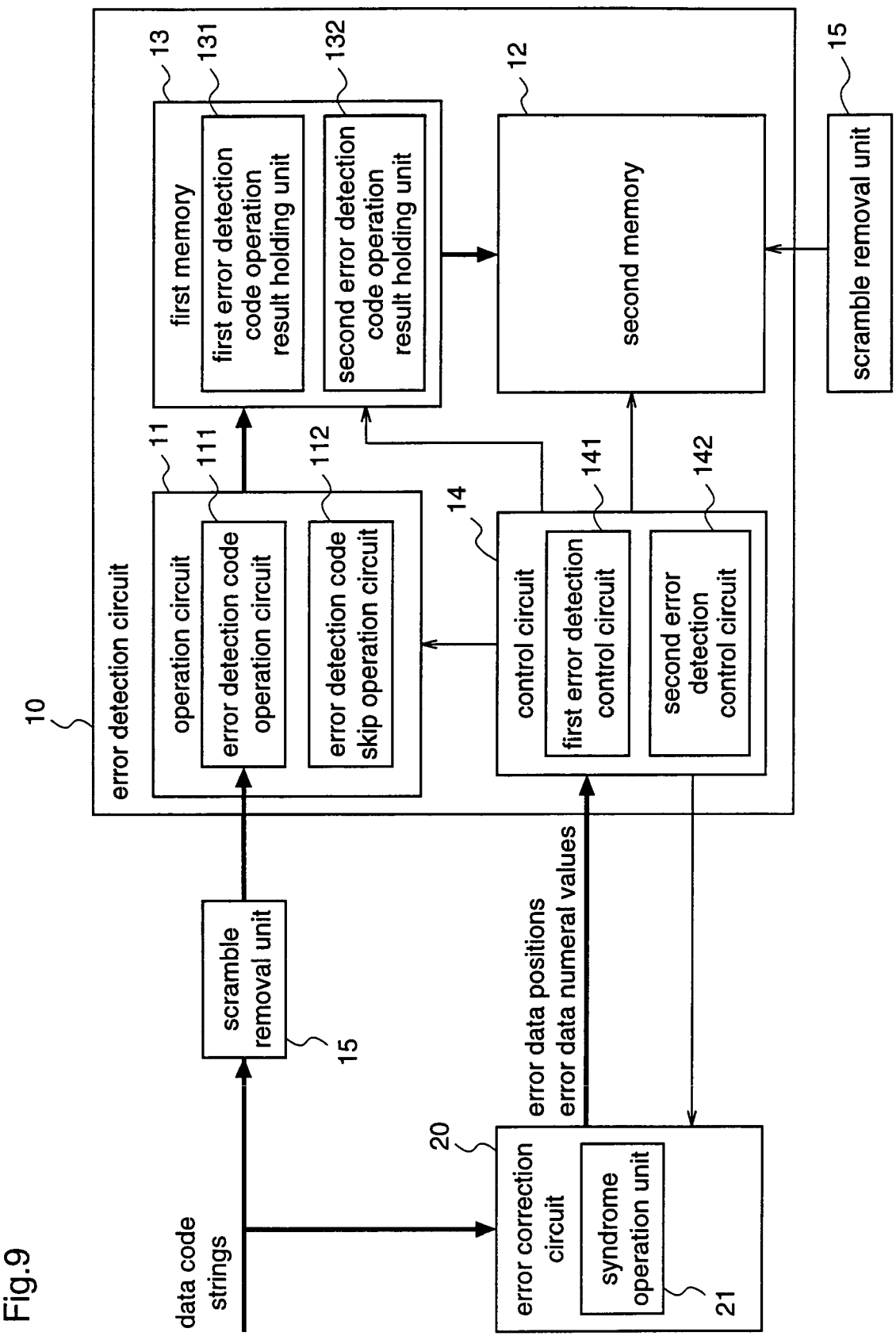
FIG. 9 is a block diagram illustrating an error detection circuit in a case where scramble components are removed every time a target code string is inputted, according to the first embodiment of the present invention.
Figure 10:
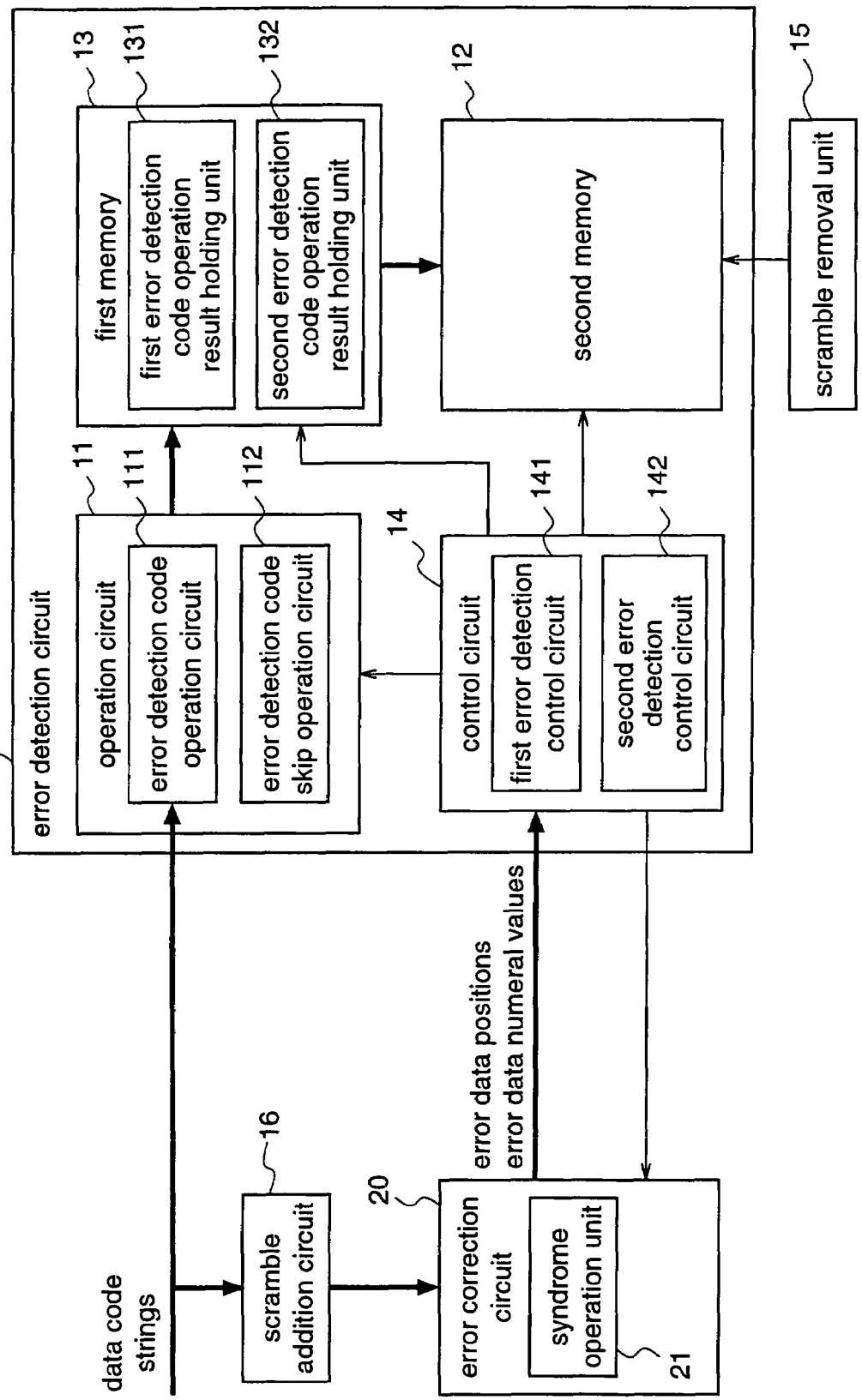
FIG. 10 is a block diagram illustrating an error detection circuit in a case where scramble components are added every time a data code string is inputted, according to the first embodiment of the present invention.

However, as described above, the EDC operation in step S20 in FIG. 1 may be carried out while removing scramble components every time the data code string is inputted. In this case, as shown in FIG. 9, the scramble removal unit 15 is disposed in front of the error detection circuit 10 as shown in FIG. 9. Further, when the input data code strings include no scramble components, since it is necessary to add scramble components to the data code strings for performing ECC processing, a scramble addition unit for adding scramble components is provided in front of the error correction circuit 20 as shown in FIG. 10, and the syndrome operation by the error correction circuit in step S10 shown in FIG. 1 is carried out while adding scramble components every time a data code string is inputted.

Hereinafter, a description will be given of the reason why the two memories, i.e., the "TMP_EDC_VAL" (first memory 13) and the "EDC_VAL" (second memory 12), are used when performing the error detection code operation by the error detection circuit 10.

As shown in FIG. 3, when the target data code strings are inputted in a discontinuous arrangement (the C2 direction shown in FIG. 11) to the error detection circuit 10, the data input order to the error detection circuit 10, in the column where the "COL" in the 0th sector in the one ECC block is "1", goes as follows. That is, after the 0th, 1st, 2nd, . . . , 11th data have been inputted, not the 208th data in the 0th sector but the data in the first sector, i.e., the 12th, 13th, . . . , are subsequently inputted. To be specific, the timing when the 208th data in the 0th sector shown in FIG. 3 is inputted is after the data input has completed up to the 191st data in the last row in the 15th sector as the last sector in the one ECC block shown in FIG. 11 and the 207th data in the last row as C2 parity data is inputted.

Accordingly, when the data are inputted to the error detection circuit 10 in the C2 direction shown in FIG. 11, only the EDC operation result for each column in each sector can be obtained. Therefore, a memory for holding the result of the EDC skip operation performed for one column in each sector on the basis of the previously inputted data is required at all the column positions from the 0th sector to the 15th sector ("COL" from 1 to 42), and further, a memory for holding the EDC operation result obtained for each column in each sector while adding the EDC operation result to the previously obtained operation result is required to be used individually for each sector from the 0th sector to the 15th sector.

Accordingly, in this first embodiment, the EDC operation result for one column in each sector is obtained by performing EXOR while holding it in the first memory, and the value of the first memory is stored in the resistor for each corresponding sector provided in the second memory 12, every time the EDC operation result per column is obtained, and thereafter, the value stored in the first memory 13 is reset so that the first memory can be used for obtaining an EDC operation result for one column in the next sector.

Next, a description will be given of the details of the EDC operation in the error detection code operation circuit 111 and the EDC skip operation in the error detection code skip operation circuit 112, with reference to FIG. 15.

Figure 15:
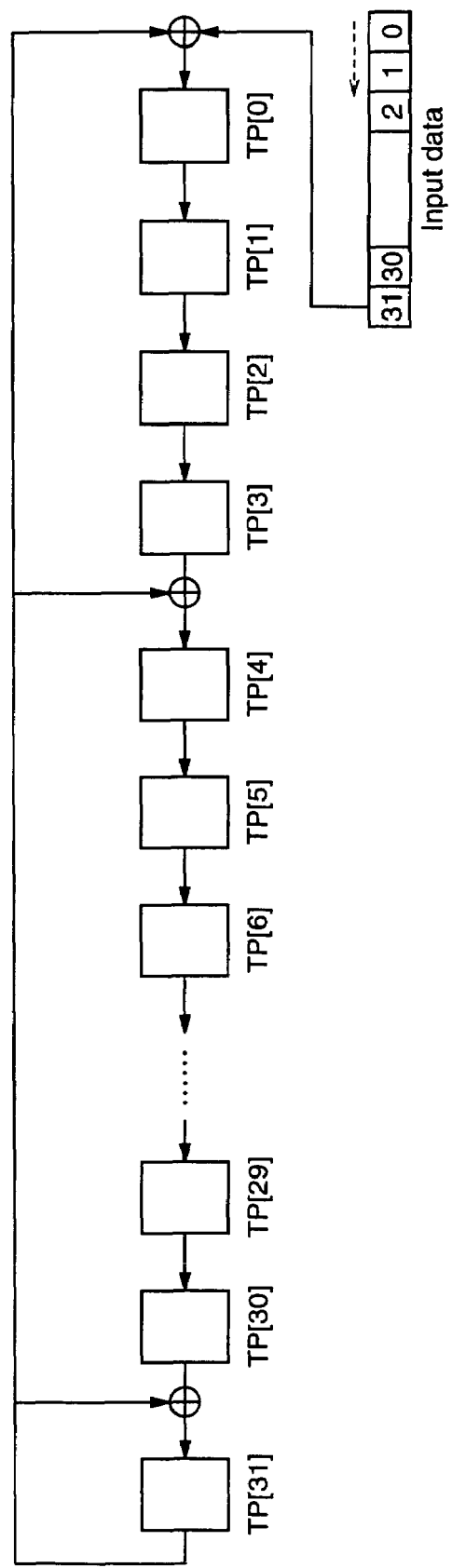
FIG. 15 is a diagram illustrating a 4-byte input EDC operation circuit.

As shown in FIG. 15, since the EDC operation circuit is composed of a 32-bit shift register, 32 bits of shift register values which are EDC operation results after inputting an arbitrary bit value to the EDC operation circuit where 0 exists at all the 32 bits, can be expressed by inter-bit relationship formulae before inputting the arbitrary bit value with respect to the respective bits of the 32 bits.

For example, when 1 bit of "0" value is input to the EDC operation circuit shown in FIG. 15, the respective bit values of the 32 bits can be expressed as follows, wherein "Bit'" indicates the state of each of the 32 bits before the one bit of "0" value is inputted.

$$Bit[0] = Bit'[31]$$
$$Bit[1] = Bit'[0]$$
$$Bit[2] = Bit'[1]$$
$$Bit[3] = Bit'[2]$$
$$Bit[4] = Bit'[3] \wedge Bit'[31]$$
$$Bit[5] = Bit'[4]$$
$$\vdots$$
$$Bit[30] = Bit'[29]$$
$$Bit[31] = Bit'[30] \wedge Bit'[31]$$

The above-mentioned 1-bit skip operation formulae are nothing more or less than an arithmetic processing formula to be used by the error detection code operation circuit 111 in the operation circuit 11 when a difference between the data previously inputted to the EDC operation circuit and the data newly inputted to the EDC operation circuit is 1 bit. Furthermore, when considering the EDC skip operation for skipping data by 168 bytes in order to maintain data continuity in steps other than step S209 shown in FIG. 4, 32 bits of shift register values which are the EDC operation results obtained after 1344 bits (168 bytes) all of which are "0" values are input to the EDC operation circuit shown in FIG. 15 wherein "0" exists at all the 32 bits, can be expressed as follows, wherein "Bit'" indicates the state of each of the 32 bits before the one bit of "0" value is inputted.

$$Bit[0] = Bit'[0] \wedge$$
$$Bit'[1] \wedge Bit'[2] \wedge Bit'[3] \wedge Bit'[5] \wedge Bit'[6] \wedge Bit'[7] \wedge Bit'[9] \wedge Bit'[10] \wedge$$
$$Bit'[11] \wedge Bit'[13] \wedge Bit'[14] \wedge Bit'[15] \wedge Bit'[17] \wedge (Bit)'[$$
$$18] \wedge Bit'[19] \wedge Bit'[21] \wedge Bit'[22] \wedge Bit'[23] \wedge$$
$$Bit'[24] \wedge Bit'[25] \wedge Bit'[26] \wedge Bit'[27] \wedge$$
$$Bit'[28] \wedge Bit'[29] \wedge Bit'[30] \wedge Bit'[31]$$

$$Bit[1] = Bit'[0] \wedge Bit'[1] \wedge Bit'[2] \wedge Bit'[3] \wedge Bit'[4] \wedge Bit'[6] \wedge$$
$$Bit'[7] \wedge Bit'[8] \wedge Bit'[10] \wedge$$
$$Bit'[11] \wedge Bit'[12] \wedge Bit'[14] \wedge Bit'[15] \wedge Bit'[16] \wedge Bit'[18] \wedge$$
$$Bit'[19] \wedge Bit'[20] \wedge Bit'[22] \wedge Bit'[23] \wedge Bit'[$$
$$24] \wedge Bit'[25] \wedge Bit'[26] \wedge Bit'[27] \wedge$$
$$Bit'[28] \wedge Bit'[29] \wedge Bit'[30] \wedge Bit'[31]$$

$$Bit[2] = Bit'[0] \wedge Bit'[1] \wedge Bit'[2] \wedge Bit'[3] \wedge Bit'[4] \wedge Bit'[5] \wedge$$
$$Bit'[7] \wedge Bit'[8] \wedge Bit'[9] \wedge$$
$$Bit'[11] \wedge Bit'[12] \wedge Bit'[13] \wedge Bit'[15] \wedge Bit'[16] \wedge Bit'[17] \wedge$$
$$Bit'[19] \wedge Bit'[20] \wedge Bit'[21] \wedge Bit'[23] \wedge$$
$$Bit'[24] \wedge Bit'[25] \wedge Bit'[26] \wedge Bit'[27] \wedge$$
$$Bit'[28] \wedge Bit'[29] \wedge Bit'[30] \wedge Bit'[31]$$

$$Bit[3] = Bit'[0] \wedge Bit'[1] \wedge Bit'[2] \wedge Bit'[3] \wedge Bit'[4] \wedge Bit'[5] \wedge$$
$$Bit'[6] \wedge Bit'[8] \wedge Bit'[9] \wedge$$
$$Bit'[10] \wedge Bit'[12] \wedge Bit'[13] \wedge Bit'[14] \wedge Bit'[16] \wedge Bit'$$
$$[17] \wedge Bit'[18] \wedge Bit'[20] \wedge Bit'[21] \wedge Bit'[22] \wedge Bit'[24] \wedge Bit'[25] \wedge Bit'$$
$$[26] \wedge Bit'[27] \wedge Bit'[28] \wedge Bit'[29] \wedge Bit'[30] \wedge Bit \wedge [31]$$

$$Bit[4] = Bit'[4] \wedge Bit'[24]$$
$$Bit[5] = Bit'[5] \wedge Bit'[25]$$
$$\vdots$$
$$Bit[30] = Bit'[2] \wedge Bit'[3] \wedge Bit'[6] \wedge Bit'[7] \wedge Bit'[10] \wedge Bit'[11] \wedge Bit'[14] \wedge$$
$$Bit'[15] \wedge Bit'[18] \wedge Bit'[19] \wedge Bit'[30]$$
$$Bit[31] = Bit'[0] \wedge Bit'[1] \wedge Bit'[2] \wedge Bit'[4] \wedge Bit'[5] \wedge Bit'[6] \wedge Bit'[8] \wedge$$
$$Bit'[9] \wedge Bit'[10] \wedge Bit'[12] \wedge$$
$$Bit'[13] \wedge Bit'[14] \wedge Bit'[16] \wedge Bit'[17] \wedge$$
$$Bit'[18] \wedge Bit'[20] \wedge Bit'[21] \wedge Bit'[22] \wedge$$
$$Bit'[23] \wedge Bit'[24] \wedge Bit'[25] \wedge Bit'[26] \wedge$$
$$Bit'[27] \wedge Bit'[28] \wedge Bit'[29] \wedge Bit'[30]$$

The above-mentioned 168-byte skip operation formulae are nothing more or less than an arithmetic processing formula which is used by the error detection code skip operation circuit 112 in the operation circuit 11 when a difference between the data previously inputted to the EDC operation circuit and the data newly inputted to the EDC operation circuit is 168 bytes. In step S213 in FIG. 4, it is necessary to perform skip operations according to the respective "COL" values, and skip operation processing formulae according to the respective "COL" values can also be obtained in like manner as the above-mentioned 168-byte skip operation processing formulae. Therefore, in step S213 in FIG. 4, 42 types of skip operation processing formulae according to the respective "COL" values are to be prepared.

As for the processing in step S213 shown in FIG. 4, the above-mentioned skip operation may be divided into plural steps, instead of preparing 42 types of skip arithmetic processing formulae according to the respective "COL" values, whereby the number of steps in step S213 can be reduced.

Hereinafter, the case of performing the skip operation in divided steps will be described with reference to FIG. 7 which illustrates the EDC skip operation for skipping data by 168 bytes, and FIG. 8 which illustrates the case where the EDC skip operation for skipping data by 168 bytes is divided into plural steps.

Figure 7:
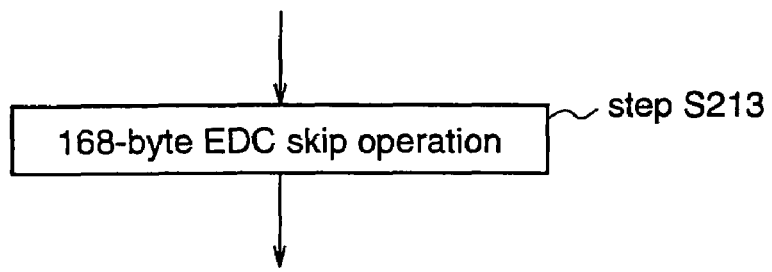
FIG. 7 is a diagram illustrating an EDC skip operation for skipping data by 168 bytes, which is performed by an error detection code skip operation circuit in the error detection circuit according to the first embodiment of the present invention.
Figure 8:
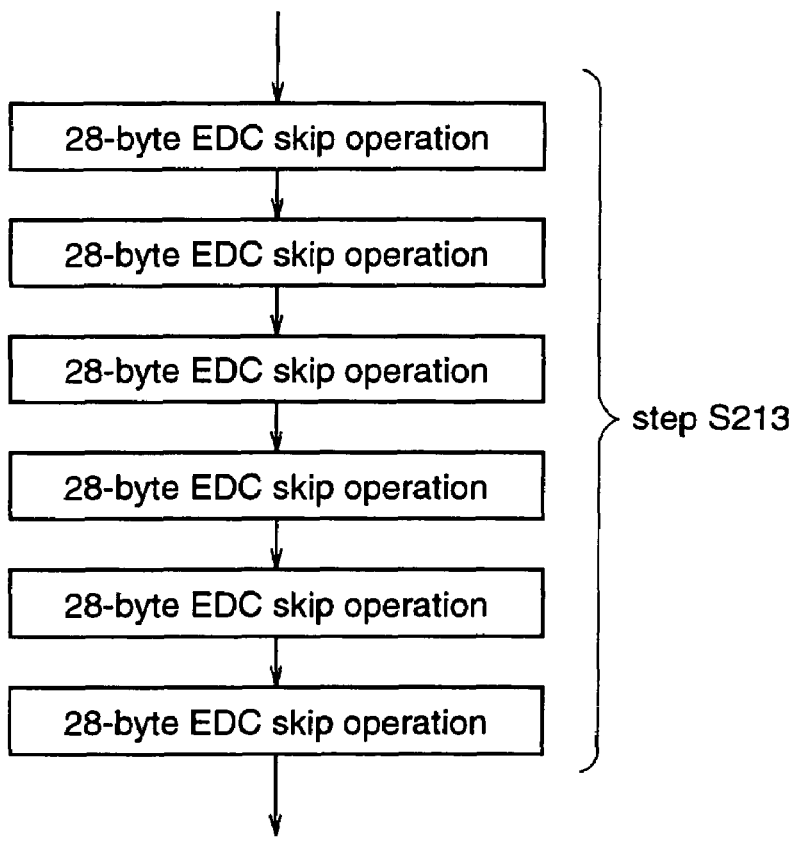
FIG. 8 is a diagram illustrating divided steps of the EDC skip operation for skipping data by 168 bytes, which is performed by the error detection code skip operation circuit in the error detection circuit according to the first embodiment of the present invention.

As shown in FIG. 7, when the "COL" shown in FIG. 3 is "0", the EDC skip operation for skipping data by 168 bytes must be carried out when the "ROW" is "11". In this way, in order to perform all the EDC operations in the sector, it is necessary to prepare 42 types of EDC skip operations corresponding to the values of "COL" from 0" to "41", leading to significant consumption of processing resources.

For example, performing an EDC skip operation for skipping data by 168 bytes is equivalent to performing six times of EDC skip operations each for skipping data by 28 bytes. Utilizing this fact, in step S213, instead of preparing 42 types of skip operation formulae individually, for example, the EDC skip operation for skipping data by 168 bytes may be changed to, as shown in FIG. 8, a method of reusing by 6 times the EDC skip operation for skipping data by 28 bytes, which skip operation exists individually. When skipping data by 168 bytes, for example, it may be thought that the EDC skip operation for skipping data by 4 bytes is reused by 42 times. However, this case requires significant processing time. Therefore, when reusing another operation result, it should be determined in view of the processing time required for the skip operation and the processing resources required for the operations to be prepared.

As described above, according to the first embodiment, inputted data code strings are subjected to a first EDC operation corresponding to bytes as an input data unit, and the operation result is stored in the first error detection code operation result holding unit 131 in the first memory 13, and thereafter, EXOR is repeated between the value stored in the first error detection code operation result holding unit 131, and the result of EDC skip operation corresponding to the number of difference bytes up to the next input data. Therefore, when performing EDC operation, even when data are inputted in a logically discontinuous direction (C2 direction in FIG. 11), EDC operation can be carried out, whereby both of ECC processing and EDC processing can be implemented in a semiconductor integrated circuit. Further, since simultaneous execution of ECC processing and EDC processing is realized, both processings ca be carried out by reading one ECC block from a buffer only one time, and it becomes unnecessary to read the ECC block that has been read from the buffer for the ECC processing, again for the EDC operation, thereby reducing consumption in the band width of the memory buffer, and suppressing increase in processing time.

Further, when the EDC skip operation by the error detection code skip operation circuit 112 in the operation circuit 11 is carried out using the processing division method, the EDC skip operation that exists separately can be reused plural times, without preparing all the EDC skip operations corresponding to the respective EDC unit columns in a sector. As a result, consumption of processing resources can be reduced.

While the above description is given to the EDC operation in the case of simultaneously executing the ECC processing and the EDC processing in the C2 direction having no logical continuity of data, the error detection circuit 10 according to the first embodiment can also execute the ECC processing and the EDC processing simultaneously in the C1 direction having logical continuity of data. In this case, in contrast to the processing in the C2 direction, since the first EDC operation is not needed to perform skip operation, only the error detection code operation circuit 111 in the operation circuit 11 is employed, and the operation result obtained for every operation unit (4 bytes) is stored in the first error detection code operation result holding unit 131 in the first memory 13. When the EDC processing for one sector has ended, the operation result held in the first error detection code operation result holding unit 131 is stored in the corresponding sector register in the second memory 12, and shifts to the EDC processing for the next sector. In the second EDC processing, like the above-mentioned processing in the C2 direction, only the data at the error data positions among the inputted data code strings are subjected to the EDC processing again, on the basis of the error data positions and error data numerical values obtained by the error detection circuit 20, and thus obtained operation result is stored in the second error detection code operation result holding unit 132 in the first memory 13. After the second EDC processing has ended, the first EDC operation result that is held in the second memory 12 at this point in time is updated using the operation result stored in the second error detection code operation result holding unit 132, thereby obtaining a correct EDC operation result.

APPLICABILITY IN INDUSTRY

An error detection apparatus and an error detection method according to the present invention are useful for performing simultaneous error correction and error detection, when recording or playing data by an optical disc recording/playback device which records or plays ECC decoded digital data at high speed.

The invention claimed is:

1. An error detection apparatus having a syndrome operator for performing syndrome operation to target code strings, each target code string comprising plural sectors and each sector comprising matrix data, and performing an error correction processing by an error correction circuit to the target code strings, and simultaneously, performing error detection to the target code strings in sector units, said apparatus comprising:

an error detection code operation circuit for calculating error detection codes in the target code strings;

an error detection code skip operation circuit for, when the target code strings are inputted in a discontinuous arrangement, performing a skip operation for correcting the inter-data continuity by skipping the data so as to make the arrangement of the code strings continuous;

a first error detection control circuit for controlling a first error detection code operation performed by the error detection code operation circuit and the error detection code skip operation circuit, which is carried out simultaneously with the syndrome operation;

a second error detection control circuit for controlling, after the error correction processing, a second error detection code operation only for data indicated by error data position on the basis of the error data positions and error data numeral values that are obtained by the error correction processing, and controlling an updation processing for updating the operation result of the first error detection code operation on the basis of the operation result of the second error detection code operation; and a memory for holding the operation results by the error detection code operation circuit, and the error detection code skip operation circuit;

wherein said error detection code skip operation circuit receives error detection codes of the target code strings which have been inputted by the last time, and performs a skip operation for skipping a predetermined number of bytes in non-final rows in the sector among the target code strings, and performs an individual skip operation for skipping a number of bytes according to column positions where data exist, in a final row in the sector; and said individual skip operation is performed by utilizing, plural times, the operation result of the skip operation which are executed in a specific column position among the column positions where data exist.

2. An error detection apparatus as defined in claim 1 wherein said memory comprises a first memory for holding the per-sector operation results by the error detection code operation circuit and the error detection code skip operation circuit when the target code strings are inputted in a continuous arrangement, and holding the halfway operation results for each sector by the error detection code operation circuit and the error detection code skip operation circuit when the target code strings are inputted in a discontinuous arrangement; and a second memory for holding the operation results transmitted from the first memory, for each sector.

3. An error detection apparatus as defined in claim 1 wherein said first memory comprises a memory for holding the operation result by the first error detection code operation which is executed by the error detection code operation circuit and the error detection code skip operation circuit, and a memory for holding a difference operation result by the second error detection code operation, for updating the operation result of the first error detection code operation.

4. An error detection apparatus as defined in claim 1 further comprising a scramble removal unit for collectively removing scramble components in the target code strings.

5. An error detection apparatus as defined in claim 4 wherein said scramble removal unit includes a table which holds data for removing scramble components in the target code strings.

6. An error detection method for performing error correction in units of error correction unit blocks for target code strings inputted in a discontinuous arrangement, each target code string being constituted by plural sectors each comprising matrix data, and simultaneously, performing error detection in sector units for the target code strings inputted in a discontinuous arrangement, said method comprising:

a syndrome operation step of performing a syndrome operation to the target code strings;

a first error detection code operation step of performing an error detection code operation to the target code strings inputted in a discontinuous arrangement, which is performed simultaneously with the syndrome operation step;

an error correction step of performing error correction by calculating error data positions and error data numeral values of the target code strings, on the basis of the syndrome obtained in the syndrome operation step;

a second error detection code operation step of performing an error detection code operation again to only data in the error data positions among the target code strings, on the basis of the error data positions and the error data numeral values which are obtained in the error correction step; and an updation step of updating the operation result by the first error detection code operation step, using the operation result by the second error detection code operation step; and each of said first error detection code operation step and the second error detection code operation step including an error detection code operation step of calculating error detection codes in the target code strings, and an error detection code skip operation step of performing a skip operation for correcting the inter-data continuity by skipping the data so as to continuously arranging the target code strings which are inputted in a discontinuous arrangement;

wherein said error detection code skip operation step receives error detection codes of the target code strings which have been inputted by the last time, and performs a skip operation for skipping a predetermined number of bytes in non-final rows in the sector among the target code strings, and performs an individual skip operation for skipping a number of bytes according to column positions where data exist, in a final row in the sector; and said individual skip operation is performed by utilizing, plural times, the operation result of the skip operation which are executed in a specific column position among the column positions where data exist.

7. An error detection method as defined in claim 6 further comprising a scramble removal step of removing scramble components included in the target code strings, which is carried out simultaneously with the updation step.

8. An error detection method as defined in claim 7 wherein, after all data in one sector are inputted, said scramble removal step removes scramble components in the all data in the sector collectively.

9. An error detection method as defined in claim 7 wherein said scramble removal step is carried out using a table which holds data for removing scramble components in the target code strings.

* * * * *